(12) United States Patent
Fujieda et al.

(10) Patent No.: US 7,732,764 B2
(45) Date of Patent: Jun. 8, 2010

(54) FIELD EMISSION ELECTRON GUN AND ELECTRON BEAM APPLIED DEVICE USING THE SAME

(75) Inventors: Tadashi Fujieda, Mito (JP); Makoto Okai, Tokorozawa (JP); Kishio Hidaka, Hitachiota (JP); Mitsuo Hayashibara, Hitachinaka (JP); Shunichi Watanabe, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 287 days.

(21) Appl. No.: 11/831,989

(22) Filed: Aug. 1, 2007

(65) Prior Publication Data
US 2008/0029700 A1  Feb. 7, 2008

(30) Foreign Application Priority Data
Aug. 2, 2006  (JP) ............... 2006-210454

(51) Int. Cl.
*H01J 31/073* (2006.01)
*H01J 37/26* (2006.01)
*H01J 37/30* (2006.01)

(52) U.S. Cl. ............. 250/310; 250/427; 250/492.3

(58) Field of Classification Search ............. 250/398, 250/310; 313/309, 414
See application file for complete search history.

(56) References Cited

U.S. PATENT DOCUMENTS 6,930,313 B2   8/2005  Fujieda et al.
7,151,268 B2   12/2006 Fujieda et al.
2002/0190622 A1*  12/2002 Hsu et al. .............. 313/309
2003/0135971 A1*  7/2003  Liberman et al. .......... 29/419.1

(Continued)

FOREIGN PATENT DOCUMENTS

JP   2002-203471   7/2002

(Continued)

OTHER PUBLICATIONS

Koichi Hata, et al.; Field emission microscopy of adsorption and desorption of residual gas molecules on a carbon nanotube tip; Surface Science 490; Jun. 8, 2001; pp. 296-300.

(Continued)

*Primary Examiner*—David A Vanore
*Assistant Examiner*—Johnnie L Smith
(74) *Attorney, Agent, or Firm*—Antonelli, Terry, Stout & Kraus, LLP.

(57) ABSTRACT

The object of the present invention is to enable the optical axis of an electron beam of a field emission electron gun mounting thereon an electron gun composed of a fibrous carbon material to be adjusted easily. Moreover, it is also to obtain an electron beam whose energy spread is narrower than that of the electron gun. Further, it is also to provide a high resolution electron beam applied device mounting thereon the field emission electron gun. The means for achieving the objects of the present invention is in that the fibrous carbon material is coated with a material having a band gap, in the field emission electron gun including an electron source composed of a fibrous carbon material and an electrically conductive base material for supporting the fibrous carbon material, an extractor for field-emitting electrons, and an accelerator for accelerating the electrons. Moreover, it is also to apply the field emission electron gun to various kinds of electron beam applied devices.

10 Claims, 3 Drawing Sheets

U.S. PATENT DOCUMENTS

2005/0045820 A1* 3/2005 Ohshima et al. ............ 250/310
2005/0199822 A1* 9/2005 Saini et al. ................. 250/398
2007/0197044 A1* 8/2007 Jacobson et al. ........... 438/758
2008/0211376 A1* 9/2008 Yasuda et al. .............. 313/414

FOREIGN PATENT DOCUMENTS

JP  2005-5266  1/2005
JP  2006-49293  2/2006
KR  2005057713 A *  6/2005

OTHER PUBLICATIONS

M.J. Fransen, et al.; Field emission energy distributions from individual multiwalled carbon nanotubes; Applied Surface Science 146; 1999; pp. 312-327.

* cited by examiner (a) (b)

FIELD EMISSION ELECTRON GUN AND ELECTRON BEAM APPLIED DEVICE USING THE SAME

FIELD OF THE INVENTION

The present invention relates to a field emission electron gun and an electron beam applied device using the same.

BACKGROUND OF THE INVENTION

A field emission electron source composed of carbon nanotube (hereinafter, referred to as a carbon nanotube electron source) is known in that it enables higher luminance and more highly stable field emission current to be obtained than those of a known field emission electron source. However, the electron beam pattern from the carbon nanotube electron source, strongly depends on the tip-end shape of the carbon nanotube, and when the tip-end of the carbon nanotube has a closed structure and a symmetrical shape, a symmetrical and homogeneous beam pattern, as disclosed in Hata. K.: Surf. Sci. 490, pp 296-300 (2001) (non patent document 1), is obtained, since there is no technology for controlling the tip-end shape of the carbon nanotube, even if the tip-end of the carbon nanotube has a closed structure, in many cases it has an asymmetrical shape. In that case, an asymmetrical electron beam pattern as disclosed in M. J. Fransen: Appl. Surf. Sci. 146, pp 312-327 (1999) (non patent document 2), can be obtained. Further, in many cases, a high-luminance beam pattern does not appear at the central portion of an electron beam pattern.

BRIEF SUMMARY OF THE INVENTION

When an electron source is mounted on an electron microscope, the optical axis of an electron beam is adjusted by mechanically tilting the electron source within a certain range, so that the electron beam emitted from the electron source passes through a plurality of holes, such as diaphragms, and sample current reaching to a sample becomes maximum. When the luminance of the central portion of the pattern of electron beams is low, and a high-luminance pattern is shifted from the pattern center over a mechanically adjustable range of the electron source, in order to secure the sample current required to obtain a sufficient image contrast, the total current emitted from the electron source must be increased unnecessarily. By this, a problem occurs, such as, in that the resolution of an electron microscope is reduced due to increase of the influence of Boersh effect of the emitted electrons and broadening of energy distribution of the emitted electrons.

A first object of the present invention is to provide a field emission electron gun mounting thereon an electron source and composed of a fibrous carbon material, which enables the optical axis of an electron beam to be adjusted easily, and electron beams having a narrow energy spread to be obtained.

A second object of the present invention is to provide a high resolution electron beam applied device mounting thereon the field emission electron gun.

The features of the present invention are various kinds of electron beam applied devices applying the below-mentioned field emission electron gun.

In order to achieve the objects of the present invention, the present invention provides a field emission electron gun comprising:
a fibrous carbon material;
an electrically conductive base material for supporting the fibrous carbon material;
an extractor for field-emitting electrons from the fibrous carbon material; and
an accelerator for accelerating the electrons,
wherein a field-emitting portion of the fibrous carbon material is coated with a coating layer containing a semiconductor or insulator.

It is preferable for the thickness of a material coating the fibrous carbon material to be set equal to or smaller than 10 nm.

It is preferred that the coating layer is composed of a plurality of layers, and at least the top surface layer of the layers is composed of a semiconductor or an insulator.

It is preferable for the diameter of the fibrous carbon material to be equal to or greater than 50 nm from a viewpoint of causing the energy spread of electrons emitted from the electron source to be narrow, further, it is preferable for the fibrous carbon material to contain nitrogen or boron. In particular, the present invention provides a field emission electron gun comprising: an electron source composed of a fibrous carbon material and an electrically conductive base material for supporting the fibrous carbon material; an extractor for field-emitting electrons; and an accelerator for accelerating electrons, wherein the percentage of emitted current to be within a range of 200 mrad of divergence angles of electron beams emitted from the fibrous carbon material, with respect to total emitted current, is equal to or greater than 5%.

Moreover, another features of the present invention are an electron microscope and an electron beam drawing system using the above-mentioned electron gun.

The present invention further provides an electron microscope for irradiating a sample with electron beams generated by an electron beam source to observe the sample, comprising an electron beam source,
wherein the electron beam source comprises: a fibroid carbon material; and an electrically conductive base material for fixing the fibroid carbon material, wherein an electron beam generating portion of the fibroid carbon material is coated with a semiconductor or an insulator,
preferably further comprising:
a sample stage;
a drive unit for driving the sample stage;
a controller for controlling the drive unit; and
a critical dimension measuring system for image-processing information obtained from the sample.

The present invention further provides an electron beam drawing system for irradiating a sample with electron beams generated by an electron beam source to subject the sample to a drawing by means of the electron beams, comprising an electron beam source,
wherein the electron beam source comprises: a fibroid carbon material; and an electrically conductive base material for fixing the fibroid carbon material,
wherein an electron beam generating portion of the fibroid carbon material is coated with a semiconductor or an insulator,
preferably wherein the fibrous carbon material contains a trivalent or pentavalent element as a valency.

Other objects, features and advantages of the invention will become apparent from the following description of the embodiments of the invention taken in conjunction with the accompanying drawings.

DESCRIPTION OF REFERENCE NUMERALS

1 ELECTRICALLY CONDUCTIVE BASE MATERIAL JOINED WITH FIBROUS CARBON MATERIAL
2 ELECTRICALLY CONDUCTIVE FILAMENT
3 ELECTRODE SUPPORT BASE
4 ELECTRODE
5 HEATING POWER SUPPLY
6 POWER SUPPLY FOR EXTRACTOR ELECTRODE
7 POWER SUPPLY FOR ACCCELERATOR ELECTRODE
8 EXTRACTOR ELECTRODE
9 ACCCELERATOR ELECTRODE
10 CARBON NANOTUBE (FIBROID CARBON MATERIAL)
11 ELECTRICALLY CONDUCTIVE COATING LAYER
12 ELECTRICALLY CONDUCTIVE BASE MATERIAL
13 FLAT SURFACE FORMED ON TIP-END PORTION OF ELECTRICALLY CONDUCTIVE BASE MATERIAL
14 FIBROUS CARBON MATERIAL
15 COATING LAYER (MATERIAL HAVING A BAND GAP)
16 ELECTRON GUN
17 ALIGNMENT COIL
18 CONDENSER LENS
19 ASTIGMATIC CORRECTION COIL
20 DEFLECTION/SCANNING COILS
21 OBJECTIVE LENS
22 OBJECTIVE LENS DIAPHRAGM
23 SAMPLE
24 SAMPLE STAGE
25 EXHAUST SYSTEM
26 SECONDARY ELECTRON DETECTOR
27 BLANKING ELECTRODE

DETAILED DESCRIPTION OF THE INVENTION

Embodiments of the present invention will be described in detail with reference to drawings.

Figure 1:
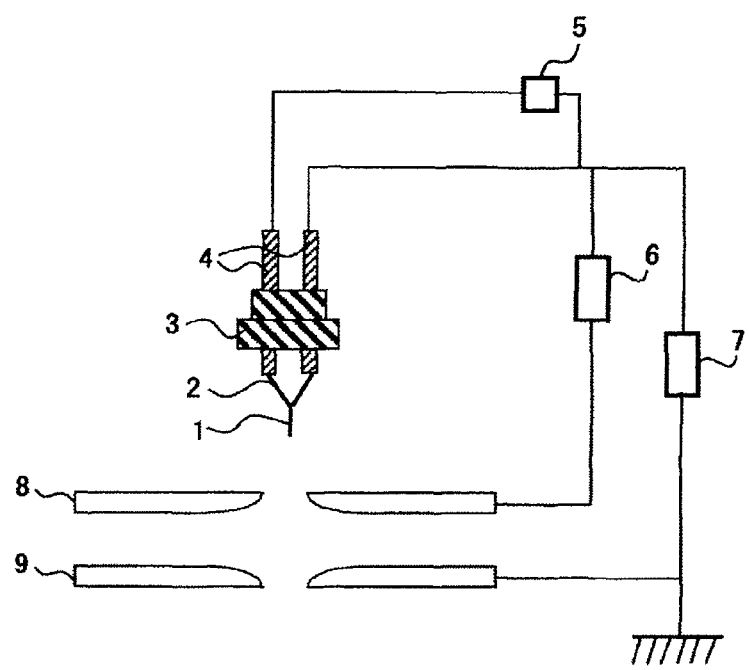
FIG. 1 is a view illustrating a field emission electron gun according to the present invention.

A configuration of the field emission electron gun, that is a feature of the present invention, will be illustrated in FIG. 1. The electron gun includes: a fibrous material coated with a semiconductor or an insulator; an electrically conductive base material; an electron source configured with electrodes, and an insulating support base for supporting them; an extractor for field-emitting electrons; and an accelerator for accelerating electrons.

Figure 2:
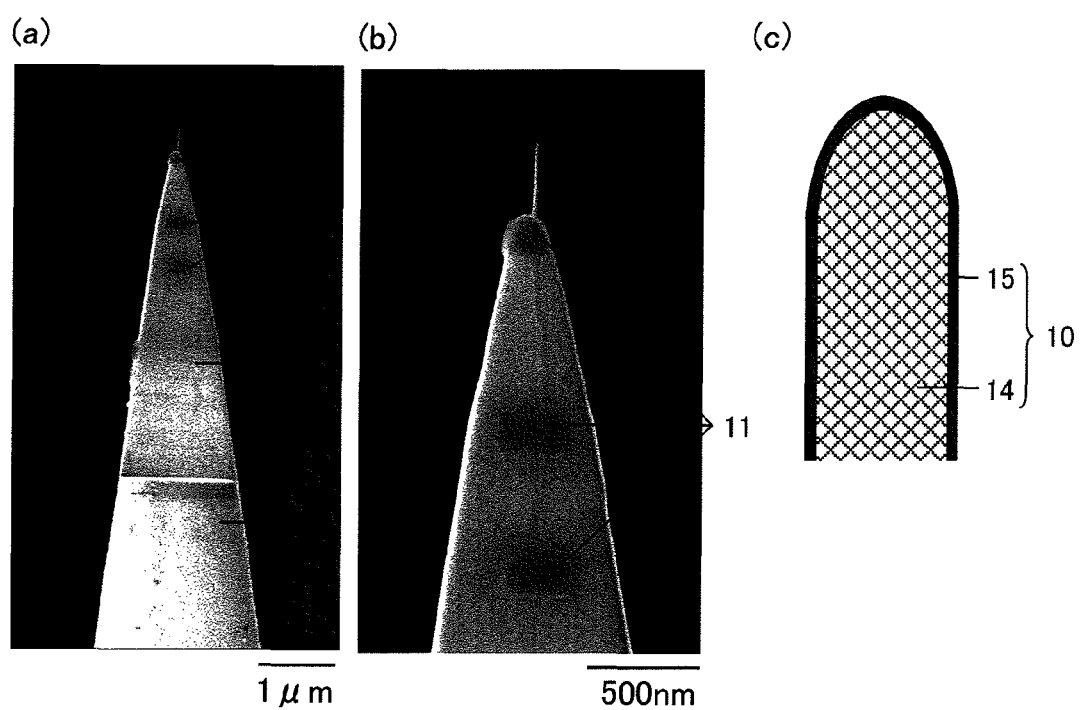
FIG. 2 is a view illustrating a detailed configuration of the tip-end portion of a field emission electron source according to the present invention.

In FIG. 2, a detailed configuration of the tip-end portion of an electron source according to the present invention is illustrated. The electron source comprises a fibrous carbon material 14 coated with a coating layer 15 of an semiconductor or an insulator as illustrated in FIG. 2(c), and an electrically conductive base material. As shown in FIGS. 2(a) and 2(b), the joint portion of the fibrous carbon material 14 and the electrically conductive base material is reinforced by an electrically conductive coating layer 11.

Figure 3:
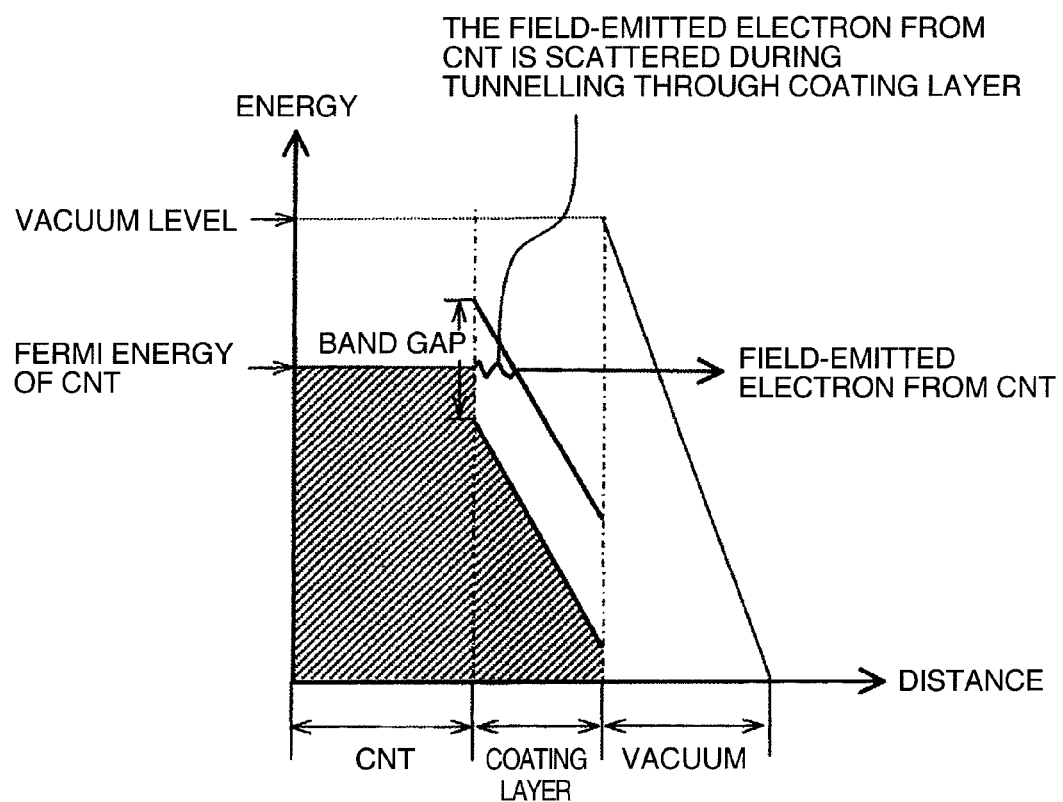
FIG. 3 is a view illustrating a mechanism of field emission of electrons in an electron source according to the present invention.

It is preferable for the material of the coating layer to be a semiconductor or an insulator. It is considered that since these materials have a band gap, the effect of the present invention will occur. The band gap is referred to as an energy level from the top of the highest energy band (valence band) occupied by electrons to the bottom of the lowest vacant band (conduction band) or the energy difference between them. In FIG. 3, the mechanism of the field emission of electrons from a carbon nanotube coated with a material having a band gap, is illustrated. When electrons emitted from the carbon nanotube are transmitted through the coating layer, they collide with the atoms constituting the coating layer, and are scattered. If there is no band gap, electrons are also emitted from the coating layer, and the energy spread of electrons emitted into vacuum will increase, however, if there is a band gap, since electrons are not present there, electrons will not emitted from there, and only electrons from the carbon nanotube will be emitted into vacuum, while being scattered and dispersed.

Accordingly, if an electron beam emitting portion is coated with a material having a band gap (in particular, insulator, semiconductor, or the like), similar effect will be obtained. As a specific material of the coating layer, oxides such as MgO and ZrO, carbides such as SiC, WC and TiC, and nitrides such as BN and GaN, are included.

The existence of the band gap is understood by directly measuring the electronic state of the coating layer using a scanning tunneling microscope etc. Moreover, even if the electronic state is not measured, if the constituent is determined to be an insulator or a semiconductor, and amorphous, by means of composition analysis, it can be determined for the constituent to have a band gap. In particular, since MgO and SiC has a band gap near the Fermi energy of CNT (carbon nanotube), they are considered to be preferable. Moreover, in consideration of wettability etc. with respect to the carbon nanotube, the coating layer may have a structure where a plurality of different materials are stacked.

Since, theoretically, the thickness through which electrons tunnel is limited, it is preferable for the thickness of the coating layer to be set equal to or smaller than 10 nm. Because, if the thickness becomes thicker than 10 nm, there may occur a possibility that electrons emitted from the carbon nanotube are not transmitted by the coating layer.

As the fibrous carbon material, carbon nanotube (fibroid carbon material) or carbon fiber is preferable. As carbon fiber, such carbon fiber that is manufactured by means of, for example, vapor deposition etc., can be included. From viewpoints of field emission properties, electric resistance, and durability, it is preferable for the shape of the carbon nanotube to have a diameter being equal to or greater than 50 nm, a length of a few hundred nm to several dozens μm, and a tip-end having a closed structure. Moreover, among the field emission properties, in particular, from the viewpoint of wettability of the carbon nanotube with respect to the coating layer composed of a material having an energy spread of emitted electrons and a band gap, a carbon nanotube containing nitrogen or boron is more preferable. Moreover, by containing trivalent and pentavalent elements such as nitrogen and boron, the fibrous carbon material is hetero-structured, thereby an effect of causing the energy spread to be narrow (enabling low $\Delta E$) can be obtained.

As a method for forming a coating layer on a fibrous carbon material, especially on a carbon nanotube, a laser ablation process, an electron beam vaporizing process, and a CVD process, are included, however, it is not limited to them, in particular. Moreover, after a coating layer is formed by means of these methods, it is more preferable to subject the coating layer to heat treatment so as to crystallize it or so as to improve the crystallinity thereof. Moreover, although the coating layer is required for at least a position for emitting an electron beam of the tip-end portion of the fibrous carbon material, it may be coated on the entire fibrous carbon material.

The material of the electrically conductive base material is not limited in particular if it can conduct electricity, however, from points of heat resistance, oxidation resistance, and mechanical strength, it is preferable to be noble metals such as gold, silver and platinum group, crystalline carbon, or high melting point metals such as tungsten, tantalum, niobium and molybdenum.

Moreover, in order to enable the angle made between the central axis of the electrically conductive base material and the fibrous carbon material to be controlled, a flat plane may be formed by means of FIB (focused ion beam) processing etc., on the tip-end portion of the electrically conductive base material sharpened by means of chemical etching etc., or a groove which can contain carbon nanotube, may be formed in the flat plane.

Next, the method for forming an electrically conductive coating layer at the joint portion of the fibrous carbon material and the electrically conductive base material, will be described. By introducing a gas (for example, $W(CO)_6$) containing an electrically conductive element in a chamber and irradiating the contact portion of the fibrous carbon material and the electrically conductive base material with electron beams, the electrically conductive element (metal tungsten) can be precipitated thereon, and the electrically conductive coating layer can be formed thereon. By this method, it is possible to coat locally only the joint portion of the fibrous carbon material and the electrically conductive base material with an electrically conductive element without depositing the electrically conductive element on the carbon nanotube protruding from the electrically conductive base material, and to reinforce there.

As the gas containing the electrically conductive element, gases decomposed only by high energy heavy ion beams such as gallium ion beams usually used for FIB etc., cannot be used. This is because, if the carbon nanotube is irradiated with high energy heavy ion beams, the fibrous carbon material itself receives damage instantly, resulting in occurrence of the fracture thereof or irradiation defects thereof. For this reason, as a particle beam used for decomposing a gas, it is preferable to use an electron beam having an energy equal to or smaller than 100 keV, which does not impart damage to the fibrous carbon material, and as the gas, it is also suitable to use an organic metal gas consisting primarily of carbon or metals such as platinum, gold and tungsten, or a fluorinated gas, which are decomposed by an electron beam having an energy of 100 keV or less and vaporize at a temperature equal to or lower than 100° C. By irradiating these gases with electron beams, it is possible to form locally an electrically conductive coating layer only on the joint portion of the fibrous carbon material and the electrically conductive base material.

In addition, the configuration of the field emission electron gun is not limited to that illustrated in FIG. 1, instead, if the properties of the electron source of the present invention can be sufficiently achieved, another configuration of the field emission electron gun, for example, a conventionally well-known configuration of, a magnetic field superposed electron gun etc., can be adopted.

Figure 4:
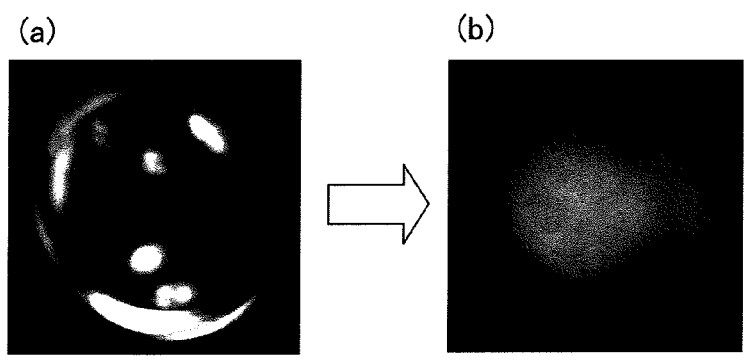
FIG. 4 is a view illustrating the influence to an electron beam pattern of a coating layer in a carbon nanotube electron source.

In FIG. 4, the influence of the coating layer on an electron beam pattern in the carbon nanotube electron source is illustrated. FIG. 4(a) is a view of the electron beam pattern before coating, and FIG. 4(b) is a view of the electron beam pattern after coating. It has been known that, as mentioned-above, by coating the carbon nanotube with a material having a band gap, electrons emitted from the carbon nanotube are scattered, thus resulting in a uniform beam pattern. It is clear that the range of a fluorescent screen irradiated with electron beams after coating, is extended than that before coating. In particular, the central portion that has not been irradiated with electron beams, and thereby has been dark before coating, is irradiated with electron beams after coating.

Moreover, when a coating layer was provided on the carbon nanotube, the percentage of the emitted current to be within a range of 200 mrad of the divergence angle of electron beams with respect to the entire emitted current was equal to or greater than 5%. In addition, the percentage of the emitted current to be within a range of 200 mrad when the shape of the tip-end portion is ideal, and thereby, six five-membered ring patterns appear during the emission of electron beams, is 5%.

Therefore, since the range irradiated with electron beams becomes larger, the optical-axis of an electron beam applied device can be adjusted easily. Moreover, even a carbon nanotube which has had a problem in the shape of the tip-end portion of CNT (carbon nanotube) and has been a cause of a defective product due to insufficient dose of electron beams when it was used for the product, can be also used as an electron source by forming the above-mentioned coating layer. Therefore, by manufacturing devices such as an electron microscope and an electron beam lithography system using such an electron source, the yield of these devices will improve greatly.

EXAMPLE 1

Figure 5:
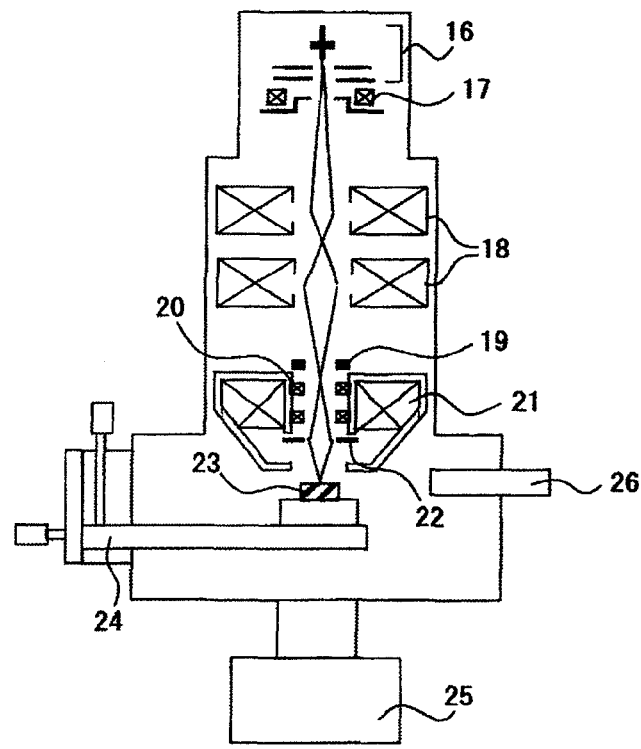
FIG. 5 is a view illustrating an example of the entire configuration of a scanning electron microscope using the field emission electron gun according to the present invention.

In FIG. 5, an entire configuration diagram of a scanning electron (SEM) using the above-mentioned electron gun is illustrated. In the scanning electron microscope, along an electron beam emitted from the electron gun 16, an alignment coil 17, condenser lenses 18, an astigmatic correction coil 19, deflection/scanning coils 20, an objective lens 21, and an objective diaphragm 22 are arranged. A sample 23 is set on a sample stage 24 so that the sample 23 can be irradiated with the electron beam. A secondary-electron detector is provided on a side-wall portion in a sample chamber. Moreover, the sample chamber is configured so as to be maintained under high vacuum by an exhaust system 25. From the configuration as described above, the electron beam emitted from the electron gun is accelerated at the anode, and converged by the electronic lens, then an infinitesimal area on the sample is irradiated with the electron beam. The irradiation area is two-dimensionally scanned, and such electrons as secondary electrons or reflected electrons emitted from the sample are detected by the secondary-electron detector 26. Finally, an enlarged image is formed based on a difference in amounts of the detected signals.

Application of the electron gun according to the present invention to the scanning electron microscope enables a high resolution scanning electron microscope to be achieved, in which the optical axis of the electron beam is easily adjusted.

Moreover, it can also be applied to a device whose basic configuration is the same as that of FIG. 5, for example, a critical dimension SEM by which a microprocessing pattern is observed, and a size is measured, and the same effect can be obtained. The critical dimension SEM has the same basic configuration from the electron source to the sample stage as that of the usual electron microscope, and differs from it in the configuration of the sample stage and in that a critical dimension measuring system by means of image processing is mounted thereon. It includes a mechanical structure and a control system which enable the sample stage to be moved at high speed, and an image processing system etc.

Further, the configuration of the scanning electron microscope mounting thereon the field emission electron gun is not limited to that illustrated in FIG. 5. Instead, whatever conventionally well-known configuration can be adopted as long as it enables properties of the field-emission electron gun to be fully derived, thus enabling fluctuation of the luminance of electron beams to be dissolved.

EXAMPLE 2

Figure 6:
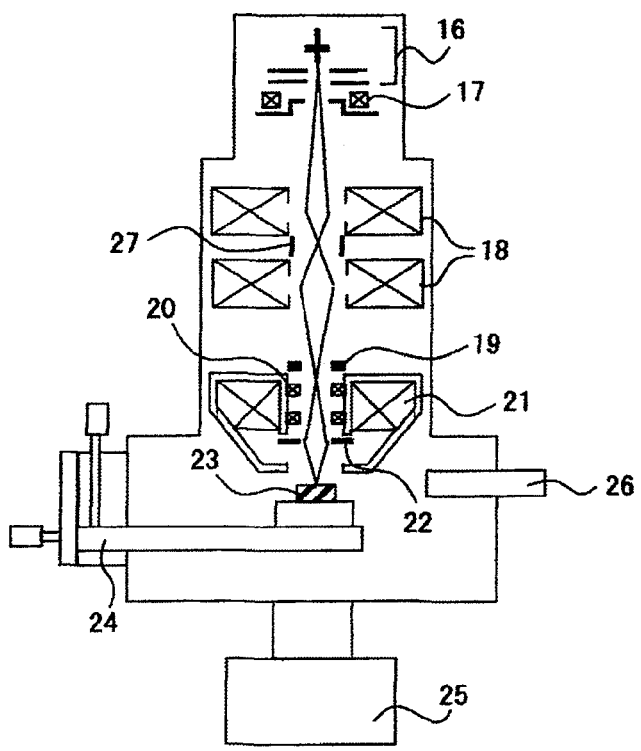
FIG. 6 is a view illustrating an example of the entire configuration of an electron beam drawing system using the field emission electron gun according to the present invention.

In FIG. 6, an example of an entire configuration diagram of an electron beam drawing system mounting thereon an electron gun according to the present invention, is illustrated. The basic configuration of the electro-optical system thereof is substantially the same as that of the above-described scanning electron microscope. An electron beam obtained from an electron gun 16 by field emission is focused by condenser lenses 18, and converged onto a sample 23 by an objective lens 21, thus, resulting in a beam spot of nano-meter order. At that time, the center of a blanking electrode for controlling an on/off of the irradiation of the sample with electron beams should coincide with a cross-over point made by the condenser lenses.

The electron beam drawing is carried out by irradiating the sample with electron beams while controlling the on/off of the electron beams by the blanking electrode, and deflecting and scanning the electron beam on the sample by deflection/scanning coils. The electron beam drawing system has a function for irradiating a sample substrate with electron beams, which is coated with photo-sensitive resist, to form various kinds of circuit patterns, however, being accompanied with the high-definition patterns of the various kinds of circuit, an electron gun enabling an extremely-small probe diameter to be obtained, has become necessary.

Conventionally, the thermoelectron-emission electron sources composed of a tungsten filament or $LaB_6$ have been used, however, these electron guns has an advantage of being able to generate a large amount of beam current, but exhibit large axial astigmatism due to absolute magnitude of the radius of the tip-end of an emitter, thus disabling drawing of 20 nm or less to be performed. For this reason, in recent years, a field emission gun configured with a single crystal tungsten electron source has come to be used, however, due to smallness and instability of the beam current, drawing could not be carried out surely. Application of the electron gun according to the present invention enables the above-mentioned problems to be solved. In addition, coating the carbon nanotube especially with MgO causes current to be stable.

It should be further understood by those skilled in the art that although the foregoing description has been made on embodiments of the invention, the invention is not limited thereto and various changes and modifications may be made without departing from the spirit of the invention and the scope of the appended claims.

ADVANTAGES OF THE INVENTION

According to the present invention, a field emission electron gun mounting thereon an electron gun can be provided, which enables the optical axis thereof to be adjusted easily and electron beams having a narrow energy spread to be obtained, and is composed of a fibrous carbon material, and, by mounting the field emission electron gun, high resolution electron beam applied devices can be provided.

The invention claimed is:

1. A field emission electron gun comprising:
   a fibrous carbon material;
   an electrically conductive base material for supporting the fibrous carbon material;
   an extractor for field-emitting electrons from the fibrous carbon material; and
   an accelerator for accelerating the electrons,
   wherein a field-emitting portion of the fibrous carbon material is coated with a coating layer containing a semiconductor or insulator.

2. The field emission electron gun according to claim 1, wherein the coating layer contains an oxide, carbide or nitride.

3. The field emission electron gun according to claim 1, wherein the thickness of the coating layer of the field-emitting portion is equal to or smaller than 10 nm.

4. The field emission electron gun according to claim 1, wherein the coating layer is composed of a plurality of layers, and at least the top surface layer of the layers is composed of a semiconductor or an insulator.

5. The field emission electron gun according to claim 1, wherein the diameter of the fibrous carbon material is equal to or larger than 50 nm.

6. The field emission electron gun according to claim 1, wherein the fibrous carbon material contains nitrogen or boron.

7. An electron microscope for irradiating a sample with electron beams generated by an electron beam source to observe the sample, comprising an electron beam source,
   wherein the electron beam source comprises: a fibroid carbon material; and an electrically conductive base material for fixing the fibroid carbon material,
   wherein an electron beam generating portion of the fibroid carbon material is coated with a semiconductor or an insulator.

8. The electron microscope according to claim 7 further comprising:
   a sample stage;
   a drive unit for driving the sample stage;
   a controller for controlling the drive unit; and
   a critical dimension measuring system for image-processing information obtained from the sample.

9. An electron beam drawing system for irradiating a sample with electron beams generated by an electron beam source to subject the sample to a drawing by means of the electron beams, comprising an electron beam source,
   wherein the electron beam source comprises: a fibroid carbon material; and an electrically conductive base material for fixing the fibroid carbon material,
   wherein an electron beam generating portion of the fibroid carbon material is coated with a semiconductor or an insulator.

10. The field emission electron gun according to claim 1, wherein the fibrous carbon material contains a trivalent or pentavalent element as a valency.

* * * * *